(12) United States Patent
Yoo

(10) Patent No.: US 6,876,232 B2
(45) Date of Patent: Apr. 5, 2005

(54) METHODS AND ARRANGEMENTS FOR ENHANCING DOMINO LOGIC

(75) Inventor: Seung-Moon Yoo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 10/645,042

(22) Filed: Aug. 21, 2003

(65) Prior Publication Data

US 2005/0040857 A1 Feb. 24, 2005

(51) Int. Cl.[7] .............................................. H03K 19/094
(52) U.S. Cl. .......................................... 326/98; 326/95
(58) Field of Search ............................ 326/93, 95, 98; 327/208–212, 214, 215, 224, 225

(56) References Cited

U.S. PATENT DOCUMENTS

| | | | |
|---|---|---|---|
| 6,404,235 B1 * | 6/2002 | Nowka et al. | 326/96 |
| 6,707,318 B2 * | 3/2004 | Kumar et al. | 326/98 |
| 6,791,365 B2 * | 9/2004 | Bosshart | 326/98 |

OTHER PUBLICATIONS

Anis, M.H. et. al, "Energy–Efficient noise–Tolerant Dynamic Styles for Scaled–Down CMOS and MTCMOS Technologies", IEEE Transactions on Very Large Scale Integration (VLSI) Systems, Apr. 2002, pp. 71–78, v. 10, n. 2, IEEE, United States (Publisher Item Id. S 1063–8210(02)00485–7).

\* cited by examiner

*Primary Examiner*—Vibol Tan
(74) *Attorney, Agent, or Firm*—Casimer K. Salys; Jeffrey S. Schubert

(57) ABSTRACT

Methods and arrangements for enhancing domino logic are disclosed. Embodiments include a keeper circuit to pull up a domino node in response an output of an output circuit when the domino node is at a high voltage and to stop pulling up the domino node before the output changes to a first logical output. Further embodiments include an accelerator circuit to pull down the domino node when the keeper circuit stops pulling up the domino node. The domino node may couple with a pre-charge circuit and be pre-charged to a high voltage during a first portion of a clock cycle. The domino node may also couple with a logic input circuit to pull down the domino node during a second portion of the clock cycle, causing the output circuit to change the output from low to high in response to logic signals.

20 Claims, 5 Drawing Sheets

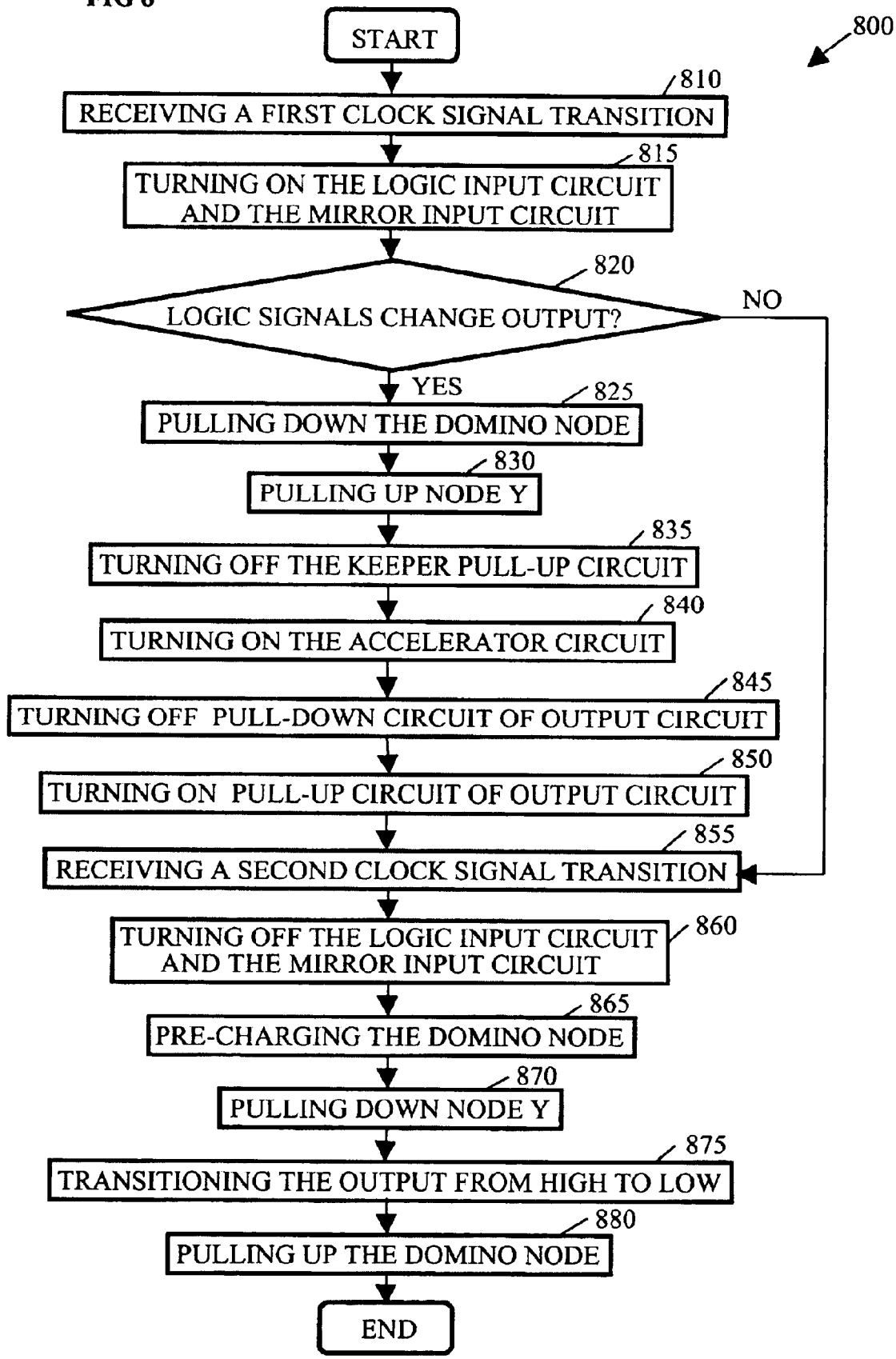

METHODS AND ARRANGEMENTS FOR ENHANCING DOMINO LOGIC

FIELD OF INVENTION

The present invention is in the field of domino logic. More particularly, the present invention relates to methods and arrangements to enhance evaluation speed, reduce noise margin, and reduce leakage.

BACKGROUND

As advances in semiconductor manufacturing technologies increase the number of transistors on a single die, computer architecture design focuses on increasing clock speeds. To reap the benefits of increased clock speeds, speed limitations associated with conventional logic must be overcome. In particular, evaluation time for synchronous logic must be reduced with increases in clock speed. Evaluation time is the time involved with generating a logical output in response to a logical input.

This continuous demand for performance improvement of integrated circuit (IC) chips has fueled the pervasive use of domino logic. When compared to conventional, complementary metal oxide semiconductor (CMOS) logic, domino logic offers high-speed operation, reduced die area, and reduced output capacitance.

Conventional domino logic includes a dynamic logic input circuit coupled with static gate circuits. A logic signal is received as an input on a first transition of a clock, and the signal is coupled to other circuitry and latched on the output on a next transition of the clock. More specifically, domino logic pre-charges a domino node, an input of the static circuitry, when a clock signal is low and couples the logic signal to the static circuitry via the dynamic logic input circuit when the clock signal is high. The dynamic logic input circuit often includes n-type metal oxide semiconductor (NMOS) transistors to pull down the voltage of the pre-charged, domino node. Then, an output circuit changes states in response to the low charge on the domino node to provide a stable output until the next clock cycle. Thus, the speed of domino logic is limited by the latencies involved with pre-charging the domino node, pulling down the pre-charged domino node voltage, and changing the state of the output circuit.

In addition, a keeper circuit is included in domino logic, compensating for leakage current, to maintain the pre-charge on the domino node. Leakage currents can cause an invalid evaluation when the domino node is discharged sufficiently by the leakage to change the output. The keeper circuit typically couples with the output and when the output indicates that the domino node is high, the keeper circuit is turned on to supply current to the domino node. The keeper circuit, however, increases evaluation time because the dynamic logic input circuit must not only pull down the pre-charge on the domino node but also the current supplied by the keeper circuit.

Solutions for reducing the latencies typically reduce the physical channel length of the circuit elements, the voltage supply for pre-charging the domino node, and the threshold voltages of selected transistors along a critical path within the domino circuit such as the threshold voltages of the transistors in the dynamic logic input circuit and the pull-up transistor in the output circuit. The short channel devices are able to change state over a smaller voltage % range more quickly by driving more current. However, the reduced threshold voltages and channel length of the transistors in the critical path result in higher subthreshold leakage currents. Thus, the keeper circuit must be sufficiently robust to handle the increased leakage currents, at the expense of increased evaluation time resulting from increased charge to be dissipated by the dynamic logic input circuit.

Further, the low threshold voltages along with faster signal edges increase problems associated with charge sharing and noise susceptibility. Charge sharing involves reduction of the voltage level at the domino node resulting from the capacitances associated with the domino node and the dynamic logic input circuit. Noise problems due to smaller geometry, often gauged by a measurement referred to as noise margin, result from noise coupling between, e.g., the inputs of the dynamic logic input circuit and the domino node. For instance, a noise introduced at the input of a low threshold voltage transistor in the dynamic logic input circuit may turn on the logic and drain current from the domino node, resulting in an invalid evaluation and output. Higher threshold voltage transistors can be implemented in the critical path through the domino circuit to compensate for higher noise, but such substitutions also increase evaluation time.

SUMMARY OF THE INVENTION

The problems identified above are in large part addressed by methods and arrangements for enhancing domino logic. One embodiment provides a circuit for domino logic wherein an output of the domino logic is based upon a charge on a domino node in response to a logic signal. The circuit generally includes a first keeper transistor having a gate coupled with the output; a second keeper transistor having a channel coupled in series with a channel of the first keeper transistor, the channels being between a high voltage source and the domino node; and an input transistor having a gate coupled with the logic signal and a channel coupled between a gate of the second keeper transistor and the high voltage source.

Another embodiment provides an apparatus for enhancing domino logic. The apparatus contemplates a logic input circuit to draw current from a domino node to generate a first logical output during a portion of a clock cycle; a clock circuit to couple the logic input circuit with a low voltage source during the portion of the clock cycle; an output circuit coupled to the domino node to output a second logical output when the domino node is above a threshold voltage; and a keeper circuit to pull up the domino node in response the output when the domino node is at a high voltage source and to stop pulling up the domino node before the output circuit outputs the first logical output.

A further embodiment provides a method for enhancing domino logic. The method can involve removing charge from a domino node via a first path in response to a logic signal; supplying charge from a high voltage source to a second node in response to the logic signal, the charge on the second node opening a second path to remove charge from the domino node; and generating an output based upon the removal of charge from the domino node.

BRIEF DESCRIPTION OF THE DRAWINGS

Other objects and advantages of the invention will become apparent upon reading the following detailed description and upon reference to the accompanying drawings in which, like references may indicate similar elements:

FIG. 8 depicts an example of a flow chart for a method to enhance domino logic.

DETAILED DESCRIPTION OF EMBODIMENTS

The following is a detailed description of example embodiments of the invention depicted in the accompanying drawings. The example embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods and arrangements for enhancing domino logic are contemplated. Embodiments include a keeper circuit to pull up a domino node in response an output of an output circuit when the domino node is at a high voltage and to stop pulling up the domino node before the output changes to a first logical output. In some of these embodiments, a mirror input circuit couples with the keeper circuit to turn off, or block, the pull-up current before the voltage on the domino node falls below the threshold voltage of the output circuit. The mirror input circuit may also couple between a high voltage and an accelerator circuit to pull down the domino node while the logic input circuit is pulling down the domino node, to decrease evaluation time. In several of these embodiments, a clock circuit may substantially simultaneously couple the logic input circuit to a low voltage and the mirror input circuit to a high voltage via n-type, metal oxide semiconductor (NMOS) transistors. In other embodiments, particularly when the input logic signals are received after receiving a clock signal, a second clock signal may be generated to couple the mirror input circuit to a high voltage via a p-type, metal oxide semiconductor (PMOS) transistor, advantageously reducing the load on the clock signal.

Many embodiments use short channel transistors in the logic input circuit and the mirror input circuit to decrease evaluation time and, in one embodiment, the order of the transistors in the mirror input circuit is advantageously configured to block or partially block charge coupling introduced by the mirror input circuit when the worst cases of charge sharing is seen between the domino node and the logic input circuit.

Further embodiments include a pre-charge circuit that couples the keeper circuit with a low voltage source to pull down the voltage at an input of the keeper circuit while the domino node is high to maintain the pull up current and reduce or substantially suppress charge sharing associated with the mirror input circuit.

Figure 1:
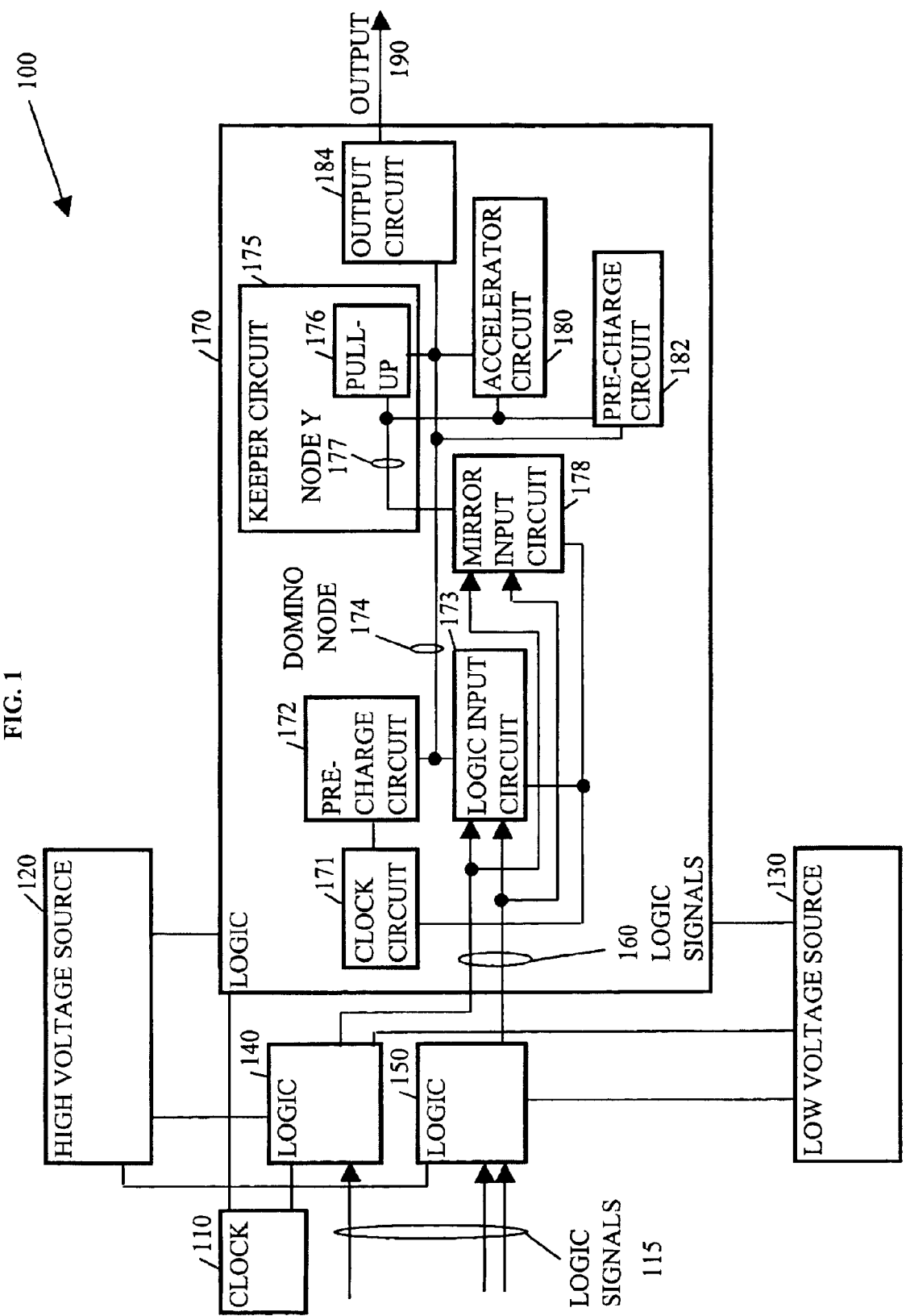
FIG. 1 depicts an embodiment of a system including a clock, voltage sources, and logic.

Turning now to the drawings, FIG. 1 depicts an embodiment of a system 100 for enhancing domino logic. More specifically, system 100 may be a domino logic circuit including a clock 110; logic signals 115 and 160; a high voltage source 120; a low voltage source 130; logic 140, 150, and 170; and output 190. In many embodiments, system 100 may include other configurations of logic, voltage sources, and clocks.

Clock 110 may include circuitry to generate a clock signal to synchronize and propagate input logic signals 115 through the logic 140, 150, and 170. In particular, clock 110 may generate a signal that switches between a low voltage and a high voltage to define pre-charge cycles and switching cycles in logic 140, 150, and 170. For instance, when clock 110 outputs a low voltage signal, logic 140, 150, and 170 may pre-charge their respective domino nodes. When clock 110 transitions to a high signal, the pre-charge cycle may end and the logic signals 115 and 160 may be propagated through logic 140, 150, and 170 to generate outputs. In some embodiments, clock 110 may be configured to generate a clock signal having a frequency based upon and/or equivalent to another clock.

Logic signals 115 may include inputs to logic 140 and 150. Logic signals 160 may be outputs of logic 140 and 150 and inputs for domino logic 170. For example, during a first clock cycle, logic 140 and 150 may generate and latch logic signals 160. Then, during a second clock cycle, domino logic 170 may generate and latch output 190 based upon voltage levels of logic signals 160.

High voltage source 120 may generate a high voltage for pre-charging domino nodes and for use as a high voltage logic signal. Low voltage source 130 may generate a low voltage for pulling down current from a domino node and for use as a low voltage logic signal. For instance, during a first portion of a clock signal, domino logic 170 may pre-charge a domino node by coupling the domino node to high voltage source 120. Then, when logic signals 160 indicate a high voltage signal output, current may be drawn to low voltage source 130 from the domino node during the second portion of the clock signal and the high voltage source 120 may be latched to output 190.

Logic 140, 150, and 170 may represent two stages of logic within system 100. Each logic 140, 150, and 170 may include OR, NOR, AND, NAND, XOR, or similar logic operations. For example, domino logic 170 may perform a NAND logic operation with logic signals 160 to generate output 190.

Logic 140, 150 and 170 may each include circuitry depicted in domino logic 170 such as a clock circuit 171, a pre-charge circuit 172, a logic input circuit 173, a domino node 174, a keeper circuit 175, a mirror input circuit 178, an accelerator circuit 180, a pre-charge circuit 182, and an output circuit 180. Clock circuit 171 may receive a clock signal from clock 110 and turn on pre-charge circuit 172 when the clock signal is at a low voltage. Then, when the clock signal transitions to a high voltage, clock circuit 171 may turn off the pre-charge circuit 172, couple the logic input circuit 173 to the low voltage source 130, and couple a mirror input circuit 178 of keeper circuit 175 to high voltage source 120.

When turned on, pre-charge circuit 172 may supply current to domino node 174 from high voltage source 120 to raise the voltage on domino node 174 to or substantially to the voltage of high voltage source 120. When turned off, pre-charge circuit 172 may not supply current to or draw current from domino node 174.

Logic input circuit 173 and mirror input circuit 178 may receive logic signals 160 and determine whether to transition output 190 to a high voltage logic signal or leave the output as a low logic signal. For example, during the first portion of the clock signal when the clock signal is at a low voltage, pre-charge circuit 172 may be on to pull up domino node 174 to a high voltage. Then, during a second portion of the clock signal, logic input circuit 173 is coupled with low voltage source 130. When logic input circuit 173 is designed to leave output 190 at a low voltage in response to logic signals 160, logic input circuit 173 draws no current or substantially no current from domino node 174. On the other hand, when logic input circuit 173 is designed to transition output 190 to a high voltage in response to logic signals 160, logic input circuit 173 draws current from domino node 174, pulling down the voltage of domino node 174 to or substantially to the voltage of low voltage source 130.

Keeper circuit 175 may supply current to domino node 174 to compensate for leakage currents, pulling up domino node 174 when domino node 174 is high and stopping or cutting off the current when logic input circuit 173 is pulling down domino node 174. In the present embodiment, accelerator circuit 180 also pulls down the voltage on domino node 174 when logic input circuit 173 is pulling down the voltage on domino node 174.

Keeper circuit 175 may include pull-up 176. Pull-up 176 turns on when a low voltage is on node Y 177 and a low voltage is on output 190. Otherwise pull-up 176 turns off. When pull-up 176 is on, pull-up 176 couples domino node 174 to high voltage source 120, supplying current to domino node 174 to maintain domino node 174 at or substantially near the voltage of high voltage source 120. In other embodiments, pull-up 176 may turn on when a high voltage is on node Y 177 and a high voltage is on output 190.

Mirror input circuit 178 includes a folded stage of the input to domino logic 170, mirroring or substantially mirroring logic input circuit 173. In other words, mirror input circuit 178 couples with logic signals 160 and is designed to perform a complimentary logical operation for logic input circuit 173 since mirror input circuit 178 couples high voltage source 120 to node Y 177 of keeper circuit 175 rather than coupling low voltage source 130 to domino node 174. For instance, when logic input circuit 173 is designed to pull down domino node 174 in response to logic signals 160 via an AND operation, mirror input circuit 178 is designed to pull up node Y 177 of keeper circuit 175 in response to logic signals 160 via a NAND operation, pulling down domino node 174 by turning on accelerator circuit 180. Note that although logic input circuit 173 and mirror input circuit 178 may be comprise substantially the same configuration of transistors, logic input circuit 173 changes the charge on the domino node from high to low, to perform an AND operation, and mirror input circuit 178 changes the charge on node Y 177 from low to high, to perform a NAND operation.

When node Y 177 is pulled up by mirror input circuit 178, pull-up 176 is turned off and accelerator circuit 180 is turned on. Accelerator circuit 180 couples domino node 174 to low voltage source 130 while logic input circuit 173 is pulling down domino node 174 to advantageously increase evaluation speed. For example, when logic input circuit 173 begins to pull down domino node 174, mirror input circuit 178 pulls up node Y 177. Pull-up 176 turns off and accelerator circuit 180 turns on, pulling additional charge from domino node 174 to low voltage source 130 in parallel with logic input circuit 173.

Pre-charge circuit 182 may pull down node Y 177 when domino node 114 is low to maintain a pull-up current via pull-up 176. On the other hand, when domino node 174 is pulled down below the threshold voltage for pre-charge circuit 182, pre-charge circuit 182 turns off, accelerating the pull-up of node Y 177 by mirror input circuit 178.

Output circuit 180 may couple output 190 with high voltage source 120 when the voltage or charge on domino node 174 is low and couple output 190 with low voltage source 130 when the voltage on domino node 174 is high. In other embodiments, output circuit 180 may couple output 190 with low voltage source 130 when the voltage or charge on domino node 174 is low and couple output 190 with high voltage source 120 when the voltage on domino node 174 is high.

Figure 2:
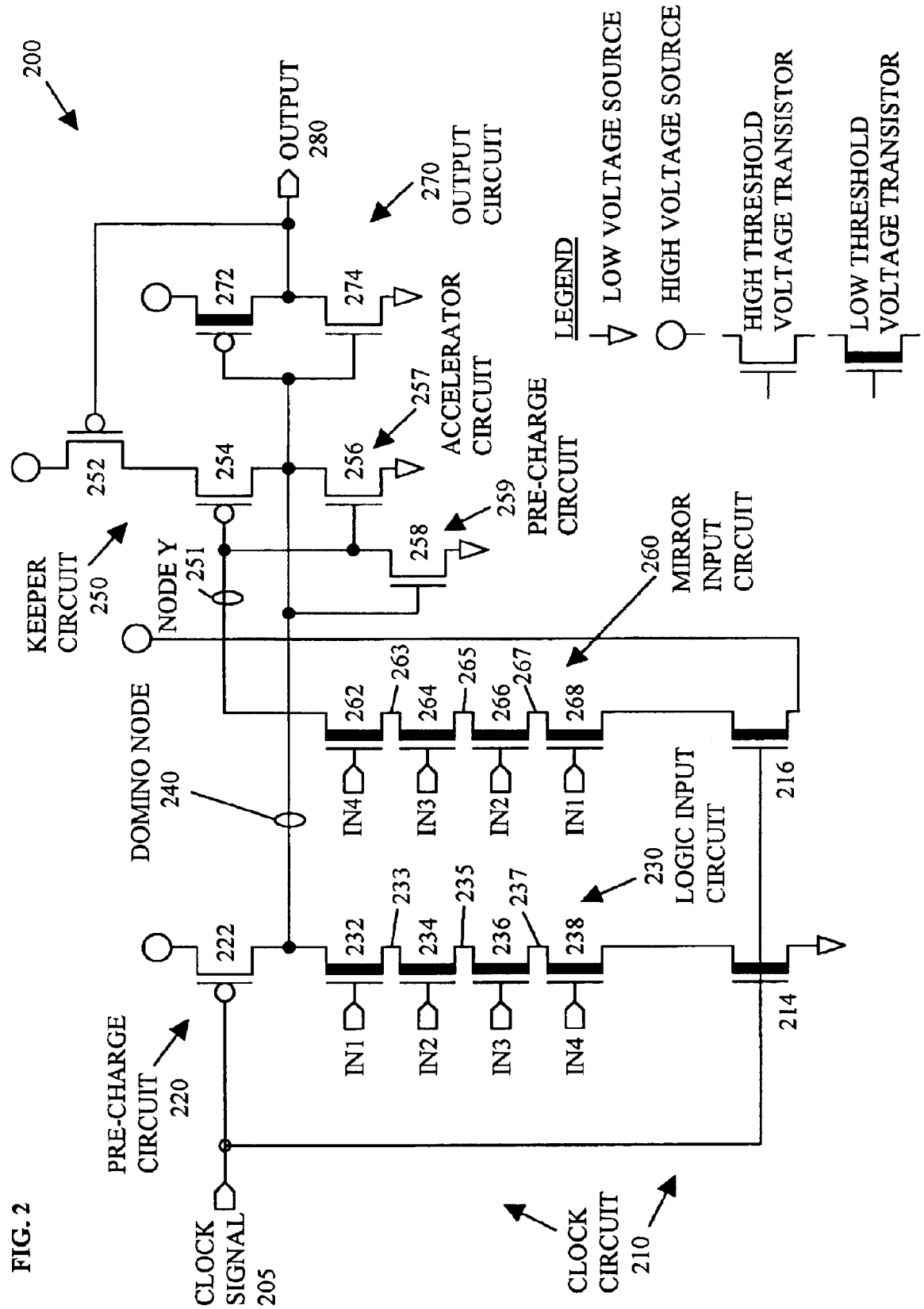
FIG. 2 depicts an embodiment of an apparatus including a clock circuit, a pre-charge circuit, a logic input circuit, a keeper circuit, and an output circuit.

Referring now to FIG. 2, there is shown an embodiment of an apparatus 200 for enhancing domino logic. Apparatus 200 may include logic such as logic 170 in FIG. 1. In particular, apparatus 200 may include a clock circuit 210, a pre-charge circuit 220, a logic input circuit 230, a domino node 240, a keeper circuit 250, a node Y 251, an accelerator circuit 257, a pre-charge circuit 259, a mirror input circuit 260, an output circuit 270, and an output 280. Clock circuit 210 may receive a clock signal 205 and coordinate synchronous operation of apparatus 200 based upon portions of a cycle of clock signal 205. Clock circuit 210 includes a coupling between clock signal 205 and pre-charge circuit 220, a low threshold, NMOS transistor 214 to couple logic input circuit 230 with a low voltage source, and a low threshold, NMOS transistor 216 to couple mirror input circuit 260 with a high voltage source. For example, when clock signal 205 is low, transistors 214 and 216 may be turned off, substantially isolating logic input circuit 230 from the low voltage source and mirror input circuit 260 from the high voltage source, respectively. On the other hand, when clock signal 205 is high, transistors 214 and 216 may be turned on, coupling logic input circuit 230 to the low voltage source and mirror input circuit 260 to the high voltage source, respectively. In other embodiments, clock circuit 210 may include additional clock circuitry to generate a second clock signal as shown in and described in conjunction with FIG. 3.

Pre-charge circuit 220 may pre-charge domino node 240 during a first portion of a cycle of clock signal 205. More specifically, pre-charge circuit 220 includes a high threshold, PMOS transistor 222. The gate of transistor 222 is coupled with clock signal 205 to turn on transistor 222 when clock signal 205 is low. The source of transistor 222 couples with a high voltage source and the drain of transistor 222 couples with domino node 240 to supply a current, or charge, to domino node 240, pulling up domino node 220 substantially to the voltage of the high voltage source.

Logic input circuit 230 may be designed to perform a logical operation like AND, NAND, OR, NOR or other operation and may include one or more transistors coupled with one or more logic signals. In the present embodiment, logic input circuit 230 is designed to perform an NAND operation with logic signals IN1–4. In particular, low threshold, NMOS transistors 232, 234, 236, and 238 are turned on when IN1–4 are high, respectively, and turned off when IN1–4 are low, respectively. For example, while clock signal 205 is low, transistor 222 pulls up domino node 240 to a high voltage. When clock signal transitions high, transistor 222 turns off and transistor 214 turns on, coupling transistors 232, 234, 236, and 238 to the low voltage source. If IN1–4 are high then current is drawn from domino node 240 to the low voltage source to drain the charge from domino node 240, pulling down domino node 240 substantially to the voltage of the low voltage source. On the other hand, when at least one of the logic signals IN1–4 is low, the corresponding transistor is turned off and substantially no current is drawn from domino node 240, except for current resulting from leakage, charge sharing, and noise coupling.

Keeper circuit 250 may pull up the domino node 240 in response to output 280 when domino node 240 is at a high voltage and stop pulling up domino node 240 before the output circuit 270 outputs the first logical output such as a high voltage. In the present embodiment, keeper circuit 250 also pulls down the voltage on domino node 240 while logic input circuit 230 is pulling down domino node 240. More specifically, keeper circuit 250 includes high threshold PMOS transistors 252 and 254 having channels coupled between the high voltage source and domino node 240 to supply current to domino node 240, compensating for leakage and charge sharing. The source of transistor 252 couples with the high voltage source, the gate of transistor 252 couples with output 280 to turn transistor 252 on when the voltage on output 280 is low, and the drain of transistor 252 couples with the source of transistor 254. The drain of transistor 254 couples with domino node 240 to supply current via transistor 252 to domino node 240 when both transistor 252 and transistor 254 are turned on.

Accelerator circuit 257 may include high threshold, NMOS transistor 256 having a channel coupled between domino node 240 and the low voltage source to pull down domino node 240 when logic input circuit 230 is pulling down domino node 240, advantageously accelerating evaluation. In particular, the drain of transistor 256 couples with domino node 240 and the source of transistor 256 couples with the low voltage source. Node Y 251 couples with the gates of transistors 254 and 256 to turn off the pull up current and turn on the pull down current, or vice versa. For instance, when node Y 251 is low, transistor 256 is turned off and transistor 254 is turned on to allow a pull up current to increase the charge on domino node 240 to a high voltage. On the other hand, when node Y 251 is high, transistor 254 is turned off, blocking the pull up current and transistor 256 is turned on to draw current from domino node 240 to the low voltage source.

Many embodiments may include pre-charge circuit 259. Pre-charge circuit 259 may include a high threshold, NMOS transistor 258 having a channel coupled between the node Y 251 and the low voltage source to pull down node Y 251 when domino node 240 is at a high voltage. The drain of transistor 258 couples with node Y 251, the source of transistor 258 couples with the low voltage source, and the gate of transistor 258 couples with domino node 240.

Mirror input circuit 260 may couple between the gates of transistors 254 and 256 and the high voltage source to turn off transistor 254 and to turn on transistor 256 when logic input circuit 230 draws current from domino node 240. In the present embodiment, mirror input circuit 260 includes a folded stage input of logic input circuit 230. More specifically, mirror input circuit 260 provides an AND operation on the same logic signals IN1–4 as logic input circuit 230, having transistors corresponding to each transistor of logic input circuit 230. For instance, when logic signals IN1–4 turn on transistors 232, 234, 236, and 238, the corresponding transistors of mirror input circuit 260, transistors 268, 266, 264, and 262, respectively, are also turned on. Thus, mirror input circuit 260 pulls up node Y 251 as logic input circuit 230 pulls down domino node 240.

Further, the order of the transistors in mirror input circuit 260 reduces charge sharing. In particular, transistor 232, the closest transistor to domino node 240, couples with logic signal IN1 in logic input circuit 230 but in mirror input circuit 260, transistor 268 couples with logic signal IN1 and is the farthest transistor away from node Y 251. As an illustration, assume that in a cycle of clock signal 205, domino node 240 is pre-charged to a high voltage node Y 251 is pre-charged low, logic signal IN4 is low, turning off transistors 238 and 262, and logic signals IN1–IN3 are high, turning on transistors 232, 234, 236, 268, 266, and 264. Charge sharing occurs between domino node 240 and junction capacitances 233, 235, and 237 associated with logic input circuit 230. However, as a result of the ordering of transistors in mirror input circuit 260, transistor 262 is turned off so charge sharing between junction capacitances 263, 265, and 267 and node Y 251 is suppressed and, in other circumstances, substantially attenuated. Further, in many embodiments, the width of the transistors 232, 234, 236, 238, 268, 266, 264, and 262 is smaller than conventional domino logic so the junction capacitances 233, 235, 237, 263, 265, and 267 are advantageously smaller.

Output circuit 270 couples with domino node 240 to output and latch a low voltage when the charge on domino node 240 is above a logic threshold voltage for output circuit 270, transistors 272 and 274, and to latch a high voltage when the charge on domino node 240 is below the logic threshold voltage for output circuit 270. Output circuit 270 may include low threshold voltage, PMOS transistor 272 and high threshold voltage, NMOS transistor 274, both having gates coupled with domino node 240. The source of transistor 272 couples with the high voltage source and the drain of transistor 272 couples with output 280 to supply a current to pull up the charge of output 280 when transistor 272 is on. The drain of transistor 274 couples with output 280 and the source of transistor 274 couples with the low voltage source to pull output 280 down when transistor 274 is turned on. In other embodiments, different configurations of transistors may be used to generate and latch output 280.

Figure 3:
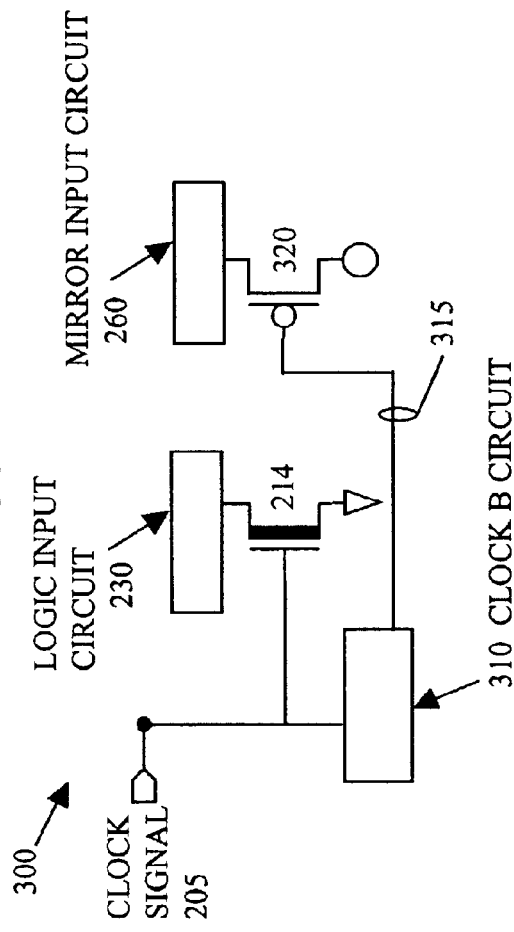
FIG. 3 depicts an embodiment of an alternate clock circuit for the embodiment in FIG. 2.

Referring now to FIG. 3, there is shown an embodiment of an alternate clock arrangement 300 for the embodiment in FIG. 2. In particular, arrangement 300 includes the apparatus 200 of FIG. 2 except clock B circuit 310 is added and high threshold, PMOS transistor 320 is substituted for mirror input circuit, clock transistor 216. Clock signal 205, logic input circuit 230, mirror input circuit 260, and logic input circuit, clock transistor 214 are shown to illustrate coupling between clock B circuit 310, high threshold, PMOS transistor 320, and the other elements of apparatus 200.

When clock signal 205 transitions to a high voltage, transistor 214 turns on and clock B circuit 310 generates an inverted, clock signal 315. The inverted, clock signal 315 couples with the gate of high threshold, PMOS transistor 320 to turn on transistor 320, coupling mirror input circuit 260 to the high voltage source. Generation of the inverted, clock signal 315 advantageously reduces the load on clock signal 205 since clock B can be used in multiple logics at the same time. In arrangement 300, the input capacitance for clock signal 205 may be the effective capacitance of the gate capacitance for transistor 214 and clock B circuit 310.

Figure 4:
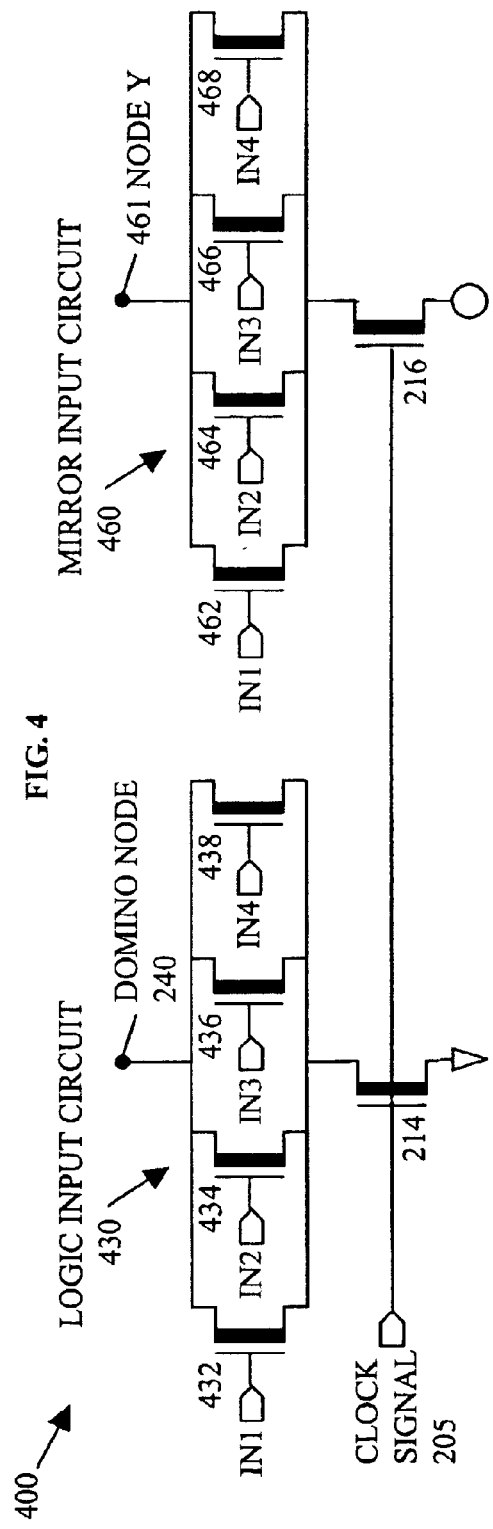
FIG. 4 depicts an embodiment of alternate logic and mirror input circuits for the embodiment of FIG. 2.

Referring now to FIG. 4, there is shown an embodiment of alternate logic input and mirror input circuits 430 and 460, respectively, for apparatus 200 of FIG. 2. In particular, arrangement 400 includes the apparatus 200 of FIG. 2 except logic input circuit 230 is replaced with logic input circuit 430 between domino node 240 and logic input circuit, clock transistor 214 and mirror input circuit 260 is replaced with mirror input circuit 460 between node Y 461 and logic input circuit, clock transistor 216.

Logic input circuit 430 includes four transistors 432, 434, 436, and 438, providing four parallel paths for current between domino node 240 and the low voltage source when the transistors 432, 434, 436, and 438 are turned on by logic signals IN1–4, respectively. For example, when logic input circuit, clock transistor 214 is turned on by a high voltage of clock signal 205, logic signal IN1 is high, and logic signals IN2–4 are low, current may be drawn from domino node 240 through transistor 432 and transistor 214 to the low voltage source.

Mirror input circuit 460 includes complimentary logic, four parallel transistors 462, 464, 466, and 468 coupled with IN1–4 respectively, to pull up node Y 461 as logic input circuit 430 pulls down domino node 240. For example, when transistor 432 pulls down domino node 240, transistor 462 pulls up node Y 461.

Figure 5:
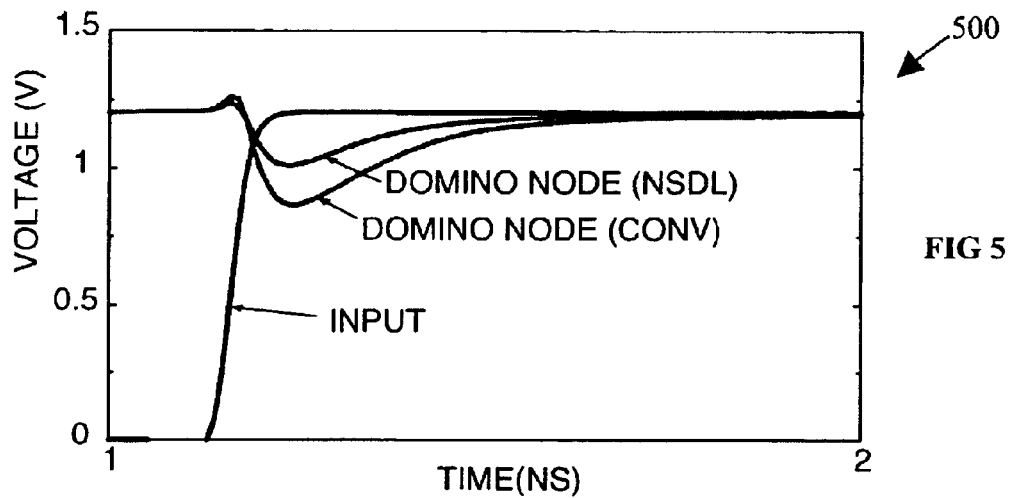
FIGS. 5–7 depict graphs of an embodiment displaying noise margin, charge sharing, and speed enhancements for the embodiment in FIG. 2.
Figure 6:
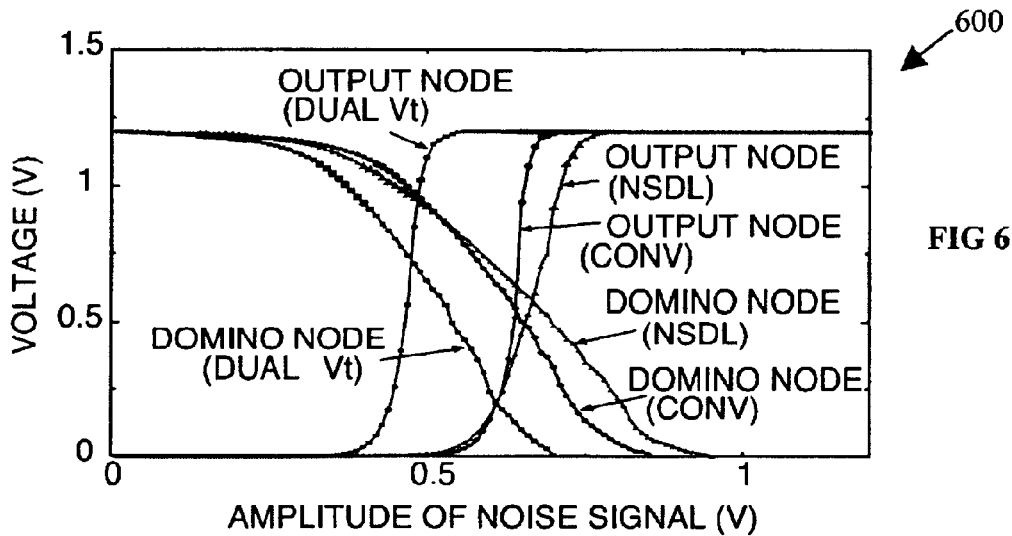
Figure 7:
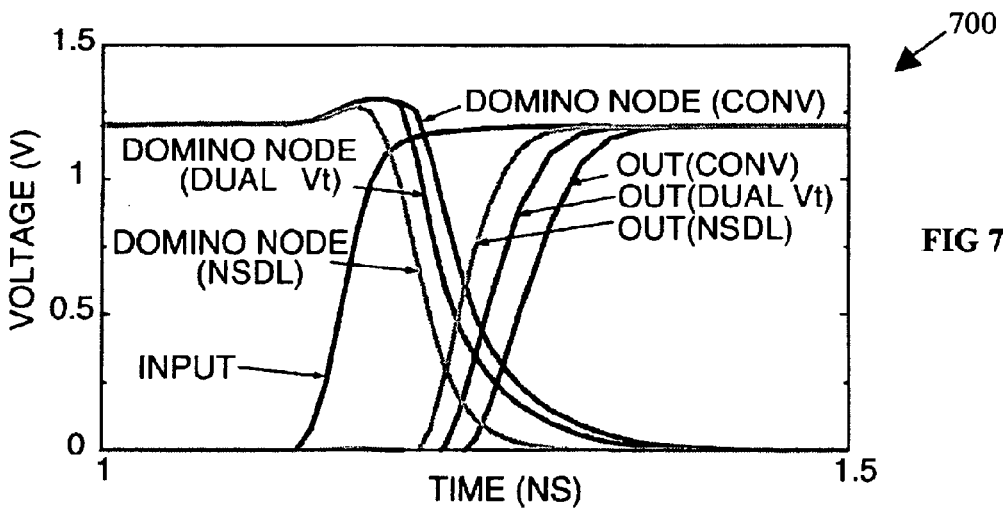

FIGS. 5–7 depict graphs of an embodiment displaying noise margin, charge sharing, and speed enhancements. In particular, FIG. 5 depicts the improvement to in recovery from charge sharing for the apparatus 200 in FIG. 2 over conventional domino logic that uses high threshold transistors in a logic input circuit like logic input circuit 230 when logic signals, IN1–3, transition high and logic signal IN4 is low. Input represents logic signals IN1–3. Domino node (CONV) describes the loss and recovery of charge on the domino node of the conventional domino logic input circuit. And domino node (NSDL) describes the loss and recovery of charge on domino node 240 of FIG. 2. Note that the loss is less and thus, the recovery is faster in apparatus 200. The loss may be less as a result of the lower junction capacitances, 233, 235, and 237 and the lower junction capacitances result from the smaller width of low threshold transistors 232, 234, 236, and 238 in the in logic input circuit 230 as compared to the width of transistors in the corresponding logic input circuit for the conventional domino logic.

FIG. 6 depicts the improvement in noise response for the apparatus 200 in FIG. 2 over conventional domino logic and dual voltage threshold (dual Vt) domino logic that uses low voltage threshold transistors in the logic input circuit like logic input circuit 230 and in the output circuit like output circuit 270 as a pull-up transistor. Various amplitudes of noise are introduced on the domino nodes of the conventional domino logic, dual Vt domino logic, and apparatus 200 with a 100 picosecond pulse. Domino node (CONV), domino node (DUAL Vt), and domino node (NSDL) represent the affect of the noise on the domino nodes of the conventional domino logic, dual Vt domino logic, and apparatus 200, respectively. Note that even as the amplitude of the noise increases, the output node of apparatus 200, output (NSDL) remains more resistant to the noise than the conventional domino logic, output node (CONV), and the dual Vt logic, output node (DUAL Vt).

FIG. 7 depicts the improvement in evaluation speed for the apparatus 200 in FIG. 2 over conventional domino logic and dual voltage threshold domino logic described for FIGS. 5 and 6. Input describes the rise of logic signals that cause logic input circuits to begin pulling down the respective domino nodes. Domino node (NSDL) represents the discharge of domino node 240 in response to the logic signals, which drops faster than the charge on the domino nodes of conventional and dual Vt domino logic, domino node (CONV) and domino node (DUAL Vt), respectively. Similarly, the charge on the output of apparatus 200, out (NSDL), rises faster than the charge on the outputs of conventional and dual Vt domino logic, out(CONV) and out(DUAL Vt), respectively.

Referring now to FIG. 8, there is shown an example of a flow chart 800 for a method to enhance domino logic. In particular, flow chart 800 describes a method for implementing enhanced domino logic in a circuit like apparatus 200 of FIG. 2, including a domino node coupled with a pre-charge circuit, a logic input circuit, an output circuit, and a keeper circuit, and a node Y coupled between a mirror input circuit and the keeper circuit to adjust the operation of the keeper circuit. Flow chart 800 begins with element 810, receiving a first clock signal transition. The first clock signal transition may include a low to high transition or a high to low transition and is received by a clock circuit configured to synchronize pre-charge and switching stages of progression wherein the pre-charge stage pre-charges the domino node and the switching stage generates and latches an output based upon the logic signals received as input. The first clock signal transition, in this embodiment, is the transition indicating progression from the pre-charge stage to the switching stage. In further embodiments, receiving the first clock signal transition may initiate generation of a second clock signal to turn on a logic input circuit, clock transistor and/or a mirror input circuit, clock transistor, advantageously reducing input capacitance of and the load on the clock signal.

Upon receipt of the first clock transition, the logic input circuit and the mirror input circuit are turned on (element 815). Turning on the logic input circuit may involve applying a voltage to the gate of a logic input circuit, clock transistor. The difference between the voltage applied and the voltage coupled with the source of the transistor may be greater than or equal to the threshold voltage for the transistor. The transistor is turned to facilitate a current between the domino node and the low voltage source via the channel of the transistor when the logic input circuit permits current between the domino node and the low voltage source (element 820). Similarly, turning on the mirror input circuit may involve applying a voltage to the gate of a mirror input circuit, clock transistor to turn on that transistor (element 820).

Current is facilitated by the logic input circuit and the mirror input circuit when the transistors of the logic input circuit, along a path between the domino node and the low voltage source, are turned on as a result of the logic signals received at the gates of the transistors of the logic input circuit. Similarly, current is facilitated by the mirror input circuit when the transistors of the mirror input circuit, along a path between the node Y and the high voltage source, are also turned on as a result of the logic signals applied to the gates of the transistors of the mirror input circuit. Otherwise, the domino logic allows the present output to remain and waits for the next clock signal transition (element 855).

As current is drawn through the logic input circuit from the domino node to the low voltage source, pulling down the domino node (element 825), current is also drawn substantially simultaneously through the mirror input circuit from the high voltage source to node Y, pulling up node Y (element 830). Node Y couples with the gate of a first keeper pull-up transistor and a accelerator transistor. Once the voltage on node Y reaches a threshold voltage for the first keeper pull-up transistor, the pull-up current for the domino node is blocked (element 835). Then, when the voltage on node Y reaches the threshold voltage of the accelerator circuit, the accelerator transistor is turned on and the current is drawn from the domino node to the low voltage source to accelerate evaluation (element 840).

Evaluation is dependent upon the time to reduce the voltage, or charge, on the domino node below the threshold voltage of a transistor in the output circuit. The output circuit may include a pull-up transistor having a gate coupled with the domino node and a channel coupled between the high voltage source and the output. The output circuit may also include a pull-down transistor having a gate coupled with the domino node and a channel coupled between the low voltage source and the domino node. As the pre-charge on the domino node is reduced, the voltage drops below the threshold voltage of the pull-down transistor for the output circuit and the pull down transistor turns off (element 845). Then, when the voltage of the domino node reaches the threshold voltage of the pull-up transistor, the pull-up transistor turns on to pull up and latch the output (element 850). Note that the threshold voltage of the pull-up transistor may be substantially equivalent to the threshold voltage of the pull-down transistor but offset slightly to avoid leakage directly from the high voltage source to the low voltage source through the channels of the pull-up and pull-down transistors in the output circuit. Further, the output may couple with the gate of a second keeper, pull-up transistor. Switching the output from low to high may turn off the second keeper, pull-up transistor, blocking pull-up current from the high voltage source, through the keeper pull-up circuit, to the domino node.

Once the output is latched, the domino logic may receive the second clock transition such as a high to low or low to high transition (element 855). Typically, the second clock transition is opposite to the first clock transition, changing the clock signal to the opposite voltage level. However, other transitions are also contemplated.

The second clock transition indicates a change from the switching stage to the pre-charge stage. In response to the transition, the logic input circuit and the mirror input circuit are substantially blocked from conducting current (element 860) although current may result from charge sharing, leakage, and noise coupling. Also, the pre-charge circuit is turned on to conduct current from the high voltage source to the domino node, pre-charging the domino node to a high voltage (element 865).

Once the voltage reaches the threshold voltage to turn on a node Y, pre-charge transistor having a channel coupled between the low voltage source and node Y, node Y is pulled down to a voltage substantially equivalent to the voltage of the low voltage source (element 870). Node Y, being coupled to the gates of the first keeper pull-up transistor and the accelerator transistor, turns on the first keeper pull-up transistor, and turns off the accelerator transistor, blocking a path between the domino node and the low voltage source.

After the first keeper pull-up transistor is turned on and the accelerator transistor is turned off, the voltage of the domino node may rise sufficiently to turn off the pull-up transistor of the output circuit and turn on the pull-down transistor of the output circuit, transitioning the output from high to low (element 875).

When the output transitions from high to low, the second keeper pull-up transistor is turned on, supplying current from the high voltage source to the domino node via the channels of the first and second keeper pull-up transistors (element 880). The pull-up current supplied to the domino node may be designed to compensate for losses of charge resulting from, e.g., charge sharing and leakage.

It will be apparent to those skilled in the art having the benefit of this disclosure that the present invention contemplates methods and arrangements for enhancing domino logic by adding circuitry to make use of short channel devices and/or circuitry to accelerate evaluation. It is understood that the form of the invention shown and described in the detailed description and the drawings are to be taken merely as examples. It is intended that the following claims be interpreted broadly to embrace all the variations of the example embodiments disclosed.

What is claimed is:

1. A circuit for domino logic wherein an output of the domino logic is based upon a charge on a domino node in response to multiple logic signals, the circuit comprising:
   a first keeper transistor having a gate coupled with the output;
   a second keeper transistor having a channel coupled in series with a channel of the first keeper transistor, the channels being between a high voltage source and the domino node; and
   an input transistor having a gate coupled with a logic signal of the multiple logic signals and a channel coupled between a gate of the second keeper transistor and the high voltage source.

2. The circuit of claim 1, further comprising an accelerator transistor having a gate coupled with the gate of the second keeper transistor and a channel coupled between a low voltage source and the domino node.

3. The circuit of claim 1, further comprising a clock transistor having a gate coupled with a clock input, and a channel coupled between the high voltage and the channel of the input transistor.

4. The circuit of claim 1, further comprising a pre-charge transistor having a gate coupled with the domino node and a channel coupled between the gate of the second keeper transistor and a low voltage source.

5. The circuit of claim 1, wherein the input transistor couples with the high voltage source via a channel of at least one other input transistor, the at least one other input transistor having a gate coupled with another logic signal of the multiple logic signals.

6. The circuit of claim 1, wherein the input transistor couples with the high voltage source in parallel with a channel of at least one other input transistor, the at least one other input transistor having a gate coupled with another logic signal of the multiple logic signals.

7. The circuit of claim 1, wherein the input transistor receives the logic signal substantially simultaneously with the receipt of the logic signal by another input transistor having a channel coupled between the domino node and a low voltage source.

8. An apparatus comprising:
   a logic input circuit to draw current from a domino node to generate a first logical output during a portion of a clock cycle;
   a clock circuit to couple the logic input circuit with a low voltage source during the portion of the clock cycle;
   an output circuit coupled to the domino node to output a second logical output when the domino node is above a threshold voltage; and
   a keeper circuit to pull up the domino node in response to the output when the domino node is at a high voltage and to stop pulling up the domino node before the output circuit outputs the first logical output.

9. The apparatus of claim 8, wherein the logic input circuit comprises an input transistor to turn on to trigger the first logical output in response to a logic signal input, pulling down the domino node via a channel of the input transistor.

10. The apparatus of claim 9, wherein a channel of the input transistor is coupled in series with a channel of a second transistor that responds to a second logic signal, the channel of the second transistor being between the clock circuit and the channel of the input transistor.

11. The apparatus of claim 9, wherein a channel of the input transistor is coupled in parallel with a channel of a second transistor that responds to a second logic signal, the channel of the second transistor being coupled between the clock circuit and the domino node.

12. The apparatus of claim 8, wherein keeper circuit comprises a keeper transistor having a gate coupled with the output circuit, and a channel coupled between the high voltage source and the domino node via a third transistor, wherein the third transistor comprises a gate coupled to a mirror input circuit, the mirror input circuit to couple the gate of the third transistor to the high voltage source to turn off the third transistor when the logic input circuit draws current from the domino node.

13. The apparatus of claim 12, further comprising an accelerator circuit having an input coupled with the mirror input circuit to couple the domino node to the low voltage source when the logic input circuit draws current from the domino node.

14. The apparatus of claim 12, wherein the mirror input circuit comprises transistors having small junction capacitances.

15. The apparatus of claim 8, wherein the logic input circuit comprises transistors having small junction capacitances.

16. A method for enhancing domino logic, the method comprising:

removing charge from a domino node via a first path in response to a logic signal;

supplying charge from a high voltage source to a second node in response to the logic signal, the charge on the second node opening a second path to remove charge from the domino node; and generating an output based upon the removal of charge from the domino node.

17. The method of claim 16, wherein removing charge comprises turning on a low threshold transistor with the logic signal to couple the domino node with a low voltage source.

18. The method of claim 16, wherein supplying charge comprises turning on a low threshold transistor with the logic signal to couple the second node with the high voltage source.

19. The method of claim 16, wherein supplying charge comprises increasing the voltage of the second node to a threshold voltage of an accelerator transistor to turn on the accelerator transistor, creating the second path via the channel of the accelerator transistor to a low voltage source.

20. The method of claim 19, wherein increasing the voltage comprises increasing the voltage to a threshold voltage of a pull-up transistor to block a third path between the high voltage source and the domino node.

* * * * *